United States Patent [19]

Kawasaki

[11] 4,347,404
[45] Aug. 31, 1982

[54] CONTROL DEVICE FOR AN AUTOMOTIVE VEHICLE FM RADIO

[75] Inventor: Teruo Kawasaki, Yokohama, Japan

[73] Assignee: Nissan Motor Co., Ltd., Japan

[21] Appl. No.: 163,280

[22] Filed: Jun. 26, 1980

[30] Foreign Application Priority Data

Jul. 2, 1979 [JP] Japan ................................ 54-82686

[51] Int. Cl.³ .............................................. H04H 5/00
[52] U.S. Cl. ............................. 179/1 GB; 179/1 GD; 179/1 VE; 179/1 D
[58] Field of Search ............ 179/1 GB, 1 GC, 1 GD, 179/1 GM, 1 G, 1 VE, 1 D; 369/86, 88; 329/167

[56] References Cited

U.S. PATENT DOCUMENTS 3,526,720  9/1970  Gourley ............................ 179/1 GB
3,991,374  11/1976  Csicsatka et al. ................ 179/1 GM
4,272,788  6/1981  Ogita ............................... 179/1 GM

FOREIGN PATENT DOCUMENTS 54-150903  11/1979  Japan .............................. 179/1 GM Primary Examiner—Douglas W. Olms
Attorney, Agent, or Firm—Lane, Aitken, Kice & Kananen

[57] ABSTRACT

A control device for an FM car radio in which low frequency characteristics of the audio output signal are switched so that stereophonic music programs can be reproduced with enough bass sound and monaural speech or news programs can be reproduced without much bass sound but with desirable articulation. One embodiment of the device comprises a capacitor-resistor filter connected in series between the amplifier and the speaker for attenuating low frequency characteristics of an audio output signal only when monaural broadcasting is being received, a transistor for shorting the filter to send bass sound directly to the speaker only when stereophonic broadcasting is being received, and a pilot signal discriminator which outputs pilot signals to turn on the transistor only when stereophonic broadcasting is being received.

5 Claims, 3 Drawing Figures

CONTROL DEVICE FOR AN AUTOMOTIVE VEHICLE FM RADIO

BACKGROUND OF THE INVENTION

1. Field of the Invention

The present invention relates generally to an FM radio for an automotive vehicle, and more particularly to the output circuit of an FM radio in which a bass sound switching unit (a bass sound reducing filter) is provided, by which stereophonic broadcasting can be enjoyed with enough bass sound and monaural broadcasting can be enjoyed without excessive bass sound but with sufficient articulation.

2. Description of the Prior Art

As is well-known, there have been various FM radio sets which have wide reproducing characteristics covering the audible range completely. In these FM radio sets, usually, a loudness control circuit is provided. This is because at lower sound levels, the sensitivity of the human ear in the high and low frequency ranges drops very markedly, and the loudness control circuit is used to adjust the output voltage-frequency response of the amplifier to compensate for this, so that the sound quality does not appear to change when the sound level changes. In other words, the output voltage-frequency response of the amplifier has flat top characteristics when the sound level is comparatively large, but the response must be strengthened in the low and high audio frequency ranges when the sound level is small, so that amplification characteristics may be fitted to human hearing characteristics.

When an FM radio set having a loudness control circuit is receiving a music broadcast with a wide dynamic range, the loudness control will provide good loudness level conditions, but when the FM radio set is receiving a speech broadcast with a narrow dynamic range by using a loudness control circuit, the sound level will be excessively strengthened in the low audio frequency range and therefore articulation will be impaired especially in speech broadcasting.

FM broadcasting includes FM stereophonic broadcasting used mainly for music and FM monaural broadcasting used mainly for conversation. Therefore, the present invention has come from an idea to switch the loudness control circuit in response to FM stereophonic broadcasting or FM monaural broadcasting.

SUMMARY OF THE INVENTION

With these problems and ideas in mind, it is the primary object of the present invention to provide an FM radio for an automotive vehicle such that enough bass sound of the amplified audio signals is heard when stereophonic broadcasting is being received, but the bass sound is reduced when monaural broadcasting is being received.

The FM radio set of the present invention comprises, as one embodiment, a capacitor-resistor filter to suppress audio signals in the low frequency range, and a transistor connected in parallel to the filter and turned on or off in accordance with the control signal produced from a pilot signal discriminator.

When stereophonic broadcasting is being received, since a pilot signal is output from the pilot signal discriminator to the transistor which is connected in parallel with the filter, through a switching control circuit, the transistor is turned on to short the filter and therefore enough bass sound of the amplified audio signals is heard. On the other hand, when monaural broadcasting is being received, since no pilot signal is output, the transistor is turned off so as to connect the filter in series with the output of the amplifier and therefore the bass sound of amplified audio signals is reduced.

BRIEF DESCRIPTION OF THE DRAWINGS

The features and advantages of an FM radio according to the present invention will be more clearly appreciated from the following description taken in conjunction with the accompanying drawings in which.

DETAILED DESCRIPTION OF THE PREFERRED EMBODIMENT

Figure 1:
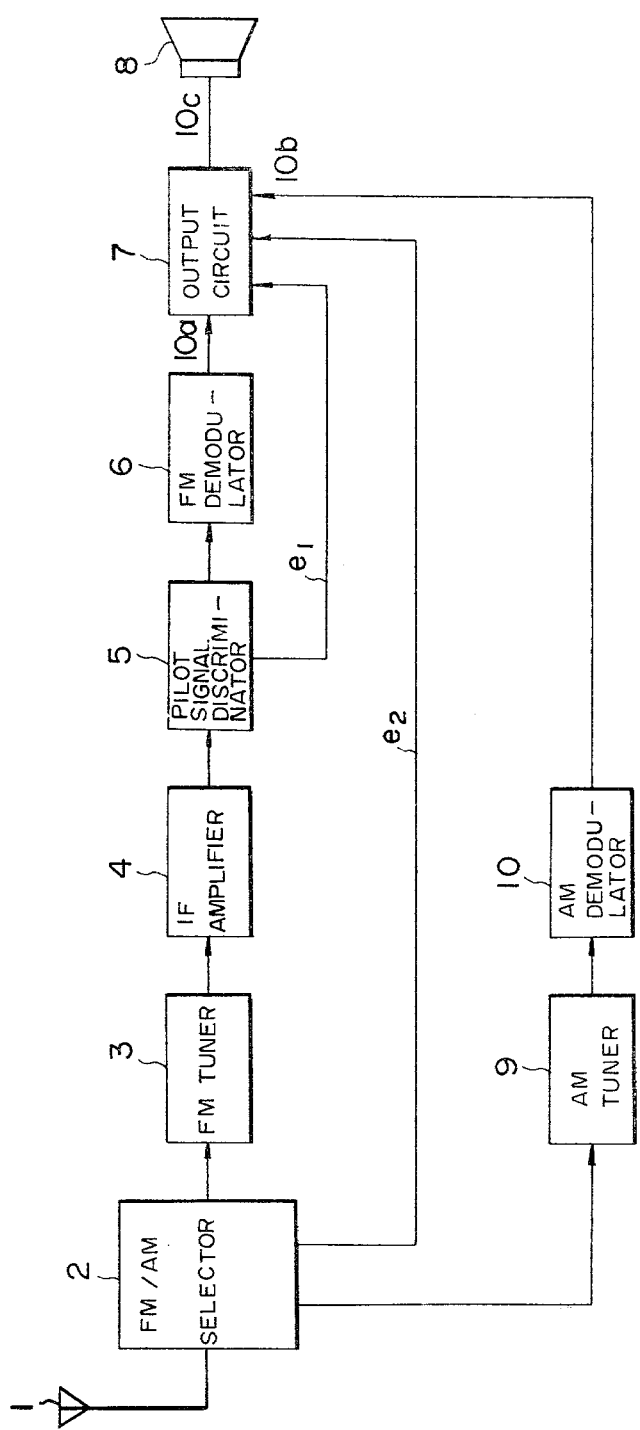
FIG. 1 is a block schematic diagram of an FM radio embodying the present invention.
Figure 2:
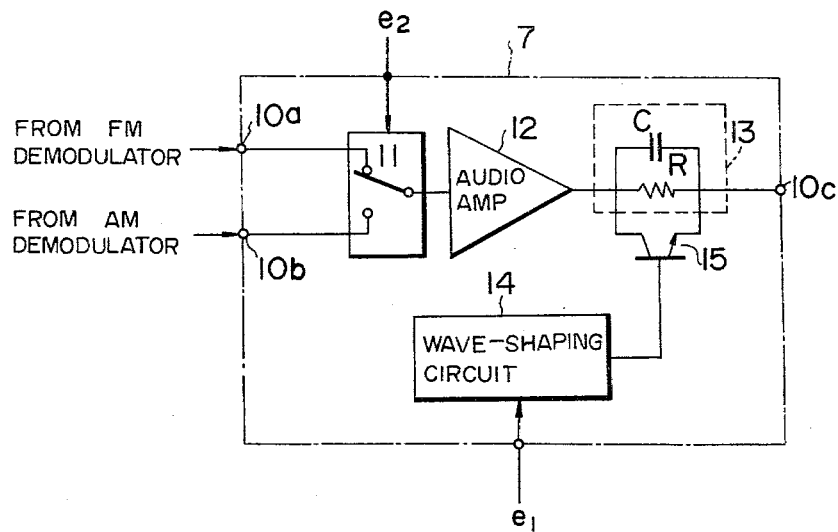
FIG. 2 is a block schematic diagram of an output circuit embodying the present invention.

FIGS. 1 and 2 illustrate a preferred embodiment of an FM car radio according to the present invention, which can also receive AM broadcasting. In FIG. 1, numeral 1 denotes an antenna, 2 denotes an FM/AM selector, 3 denotes an FM tuner, 4 denotes an intermediate frequency amplifier, 5 denotes a pilot signal discriminator, 6 denotes an FM demodulator, 7 denotes an output circuit including a bass sound reducing means, and 8 denotes a speaker.

The output signal from the pilot signal discriminator 5 is input to the output circuit 7 as a control signal $e_1$, for switching the bass sound reducing means provided in the output circuit 7.

Numeral 9 denotes an AM tuner, and 10 denotes an AM demodulator. The audio output signal from the AM demodulator 10 is amplified through the output circuit 7 and also reproduced through the speaker 8.

In addition, the output signal from the FM/AM selector 2 is applied to a selector 11 provided in the output circuit 7, as a switching signal $e_2$, for switching the output signal from the FM demodulator 6 to that from the AM demodulator 10, or vice versa, so that the audio amplifier 12 is connected to one of these two signals.

FIG. 2 shows the circuit configuration of the output circuit 7 embodying the present invention.

The output circuit 7 comprises a selector 11 switched by the switching signal $e_2$, an audio amplifier 12, a bass sound reducing means 13 such as a filter having a capacitor and resistor connected in parallel, a switching means such as a transistor 15, and a wave-shaping circuit 14 for the control signal $e_1$. The signal from the FM demodulator 6 is connected to a terminal 10a; the signal from the AM demodulator 10 is connected to another terminal 10b. The selector 11 is switched in response to the switching action of the FM/AM selector 2. Therefore, the signal from the FM or AM demodulator is amplified by the audio amplifier 12 and applied to the speaker 8 through a terminal 10c.

Having a wide dynamic range over the audible frequency range of from 10 Hz to 20,000 Hz, the audio amplifier 12 can amplify and output wide dynamic range FM sound signals without any distortion.

A filter 13, in which a capacitor C and a resistor R are connected in parallel to each other, is connected in series between the audio amplifier 12 and the speaker 8.

In addition, the collector and emitter of a transistor 15 are connected in parallel across the filter 13. If the transistor 15 is turned on, since the filter 13 is shorted through the collector and emitter of the transistor 15, the audio output signal is directly applied to the speaker 8. However, if the transistor 15 is turned off, since the filter 13 is connected in series between the audio amplifier output and the speaker 8, the audio output signal is attenuated especially in the lower audio frequency range. That is to say, the filter 13 is connected or shorted by means of the transistor 15.

The transistor 15 is turned on or off through the wave-shaping circuit 14 in accordance with the pilot signal $e_1$ produced by the pilot signal discriminator 5. The waveshaping circuit 14 serves to shape the waveform of the pilot signal $e_1$, so that the signal can turn the transistor 15 on or off stably.

Figure 3:
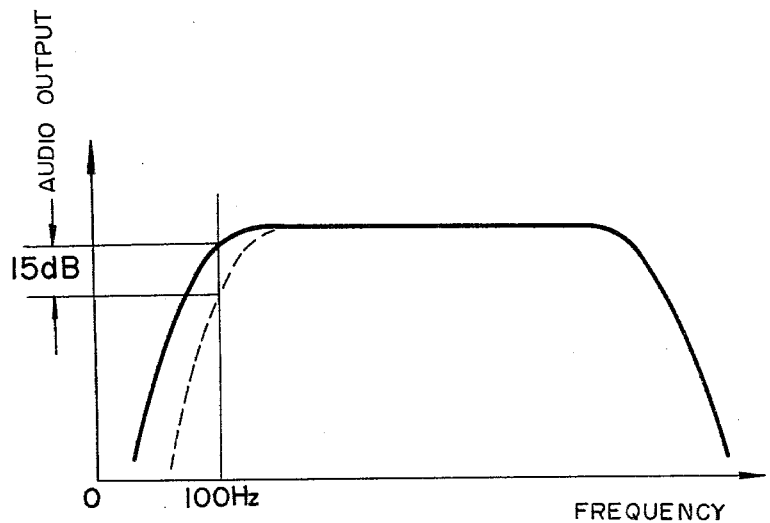
FIG. 3 is a graphical representation showing frequency characteristics of audio output signals according to the present invention.

FIG. 3 shows audio signal level-frequency characteristics when the filter 13 of the output circuit 7 is connected in series between the amplifier 12 and the speaker 8 and when shorted by the collector and emitter of the transistor 15.

In the figure, if the transistor 15 is on, since the filter 13 is shorted by the transistor 15, the signal level is directly applied to the speaker 8 without any attenuation, and therefore the frequency characteristic should be as shown by a solid line. However, if the transistor 15 is off, since the filter 13 is connected in series, the signal level is applied to the speaker 8 after being attenuated by the filter 13, and therefore the frequency characteristic should be as shown by a broken line. In this case, the output signal level is attenuated at the lower frequency range only and thus has a smaller dynamic range.

It will be understood that the illustration of the preferred embodiment in FIG. 2 is partially schematic insofar as the operation of the transistor will require an appropriate power source or biasing in a manner well known. It will also be clear to those skilled in the relevant art that depending on biasing and signal polarities, other connection configurations will be possible for the transistor.

By referring to FIGS. 1, 2, and 3 the operation of an FM receiver unit according to the present invention will now be described in more detail.

When FM broadcasting is being received, since a switch provided in the FM/AM selector 2 is set to the FM position, the selector 11 in the output circuit 7 is switched by the switching signal $e_2$ to such a position as to send the FM demodulation output from the FM demodulator 6 to the audio amplifier 12. Under this FM receiving condition, if stereo FM broadcasting is being received, since the pilot signal is superimposed on the FM signal obtained from the tuner 3 and the FM amplifier 4 so as to separate the audio signal into right and left stereo signals, a control signal $e_1$ is output from the pilot signal discriminator 5 to the output circuit 7. Therefore, the transistor 15 is turned on by the signal $e_1$, wave-shaped through the wave-shaping circuit 14, in order to short the filter 13.

Accordingly, the audio signal is directly sent to the speaker 8 and the audio signal-frequency characteristic is that shown by a solid line in FIG. 3. As will be clearly understood, since enough bass sound is reproduced through the speaker 8 over the low audio frequency range, music programs of stereophonic broadcasting can be reproduced with good sound quality.

On the other hand, if the broadcasting changes from stereophonic to monaural, such as news on the hour during FM broadcasting, since no pilot signal is superimposed on the FM signal, no control signal $e_1$ is sent to the output circuit 7 from the pilot signal discriminator 5. Accordingly, the wave-shaping circuit 14 and the transistor 15 are left turned off, and the filter 13 is left connected between the amplifier 12 and the speaker 8. Therefore, the audio signal is sent to the speaker 8 after being attenuated by the filter 13, and the audio signal-frequency characteristic is that shown by a broken line in FIG. 3. In this case, the bass sound is reduced, as compared with the case shown by the solid line, and thereby monaural broadcasting such as conversation or news can be reproduced with a good sound quality without much bass sound but with a desirable articulation. That is to say, while FM broadcasting is being received, automatically music programs are reproduced with enough bass sound but conversation programs are reproduced with sufficient articulation.

In this case, however, if the low frequency attenuating rate is too great, noise and treble sound may become excessive, thus resulting in deterioration in sound quality. For this reason, it is necessary to arrange the filter 13 so as to have an attenuation rate of less than 15 dB at 100 Hz, as shown in FIG. 3.

In addition, if the FM receiver of the present invention is switched to the AM receiver, since the FM/AM selector 2 is switched to the AM position and the selector 11 in the output circuit 7 is also switched to the AM position, no signal is sent to the FM tuner 3 and no control signal $e_1$ is sent to the switching control circuit 14; thus the transistor is left turned off and the filter 13 is left connected between the amplifier 12 and the speaker 8.

Since AM broadcasting has a narrow dynamic range, all programs can be reproduced by attenuating the low frequency range for better articulation. Further, it is possible to suppress low frequency noises such as buzzing.

Furthermore, in the case when no FM/AM selector 2 is provided, even if the selector 11 is switched to the AM position to receive AM, since a control signal $e_1$ may be sent to the switching control circuit 14, it is necessary to turn off the wave-shaping circuit 14 compulsorily by using the switching signal $e_2$ generated when the selector 11 is switched.

Although an FM car radio provided with only a single speaker is illustrated in FIG. 1 for simply explaining an embodiment of the present invention, it is, of course, possible to apply the spirit of the present invention to an FM car radio provided with two output circuits and two or more speakers.

As described above, the FM car radio of the present invention is so constituted that a filter to attenuate low-frequency range signal level may be connected automatically between the amplifier and the speaker only when monaural broadcasting is being received; therefore, conversation or news can be heard with a good sound quality without much bass sound but with a desirable articulation. On the other hand, when stereophonic broadcasting is being received, the filter is shorted by the pilot signal $e_1$ detected by a pilot signal discriminator, and therefore, stereophonic music program can be heard with enough bass sound, as with a conventional FM radio set. Accordingly, it is unnecessary to switch the loudness circuit of an FM radio manually according to the state of broadcasting.

It will be understood by those skilled in the art that the foregoing description is in terms of a preferred embodiment of the present invention wherein various changes and modifications may be made without departing from the spirit and scope of the invention, as set forth in the appended claims.

What is claimed is:

1. A bass sound control device for an FM car radio, which comprises:
    (a) an AM/FM selector for selecting AM broadcasting or FM broadcasting;
    (b) a pilot signal discriminator for outputting, where said AM/FM selector selects FM broadcasting, a control signal when stereophonic broadcasting is being received and no signal when monaural broadcasting is being received;
    (c) an AM demodulator for outputting AM audio output signals where said AM/FM selector selects AM broadcasting;
    (d) an FM demodulator for outputting FM audio output signals where said AM/FM selector selects FM broadcasting, said FM demodulator being connected to said pilot signal discriminator;
    (e) an audio amplifier for amplifying the AM audio output signals where said AM/FM selector selects AM broadcasting and the FM audio signals where said AM/FM selector selects FM broadcasting, said audio amplifier being selectively connected to said AM demodulator or said FM demodulator;
    (f) a bass sound reduction means for reducing bass sound, said bass sound reduction means being connected to said audio amplifier;
    (g) switching means responsive to the control signal outputted from said pilot signal discriminator, said switching means being connected in parallel to said bass sound reduction means to short said bass sound reduction means when stereophonic broadcasting is being received and to connect said bass sound reduction means in series to said audio amplifier when monaural broadcasting is being received;
    whereby the bass sound of the amplified FM audio signals is reproduced in stereophonic broadcasting and is reduced in monaural broadcasting.

2. A bass sound control device for an FM car radio as set forth in claim 1, which further comprises a waveshaping circuit connected between said pilot signal discriminator and said switching means and adapted to ensure proper and stable operation of said switching means.

3. A bass sound control device for an FM car radio as set forth in claim 2, which further comprises a selector for switching the AM audio output signals from said AM demodulator to the FM audio output signals from said FM demodulator or vice versa, in response to a switching operation of said AM/FM selector.

4. A bass sound control device for an FM radio as set forth in claim 1, wherein said bass sound reduction means comprises a parallel capacitor-resistor circuit.

5. A bass sound control device for an FM car radio as set forth in claim 1, wherein said switching means comprises a transistor.

* * * * *